(12) United States Patent
Fujiwara et al.

(10) Patent No.: US 7,498,671 B2
(45) Date of Patent: Mar. 3, 2009

(54) POWER SEMICONDUCTOR MODULE

(75) Inventors: Shinichi Fujiwara, Kamakura (JP);
Masahide Harada, Yokohama (JP);
Hideto Yoshinari, Hitachinaka (JP);
Shosaku Ishihara, Chigasaki (JP);
Shiro Yamashita, Fujisawa (JP); Isamu Yoshida, Fujisawa (JP); Ukyo Ikeda, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/834,724

(22) Filed: Aug. 7, 2007

(65) Prior Publication Data

US 2008/0061431 A1 Mar. 13, 2008

(30) Foreign Application Priority Data

Sep. 11, 2006 (JP) ............................. 2006-244964

(51) Int. Cl.
*H01L 23/10* (2006.01)

(52) U.S. Cl. ..................... 257/706; 257/690; 257/691; 257/692; 257/705; 257/734; 257/E33.066

(58) Field of Classification Search ................ 257/690, 257/691, 692, 693, 705, 706, 734, E33.066
See application file for complete search history.

(56) References Cited

FOREIGN PATENT DOCUMENTS

JP 2001-110957 4/2001

*Primary Examiner*—Evan Pert
*Assistant Examiner*—Tan N Tran
(74) *Attorney, Agent, or Firm*—Antonelli, Terry, Stout & Kraus, LLP.

(57) ABSTRACT

A semiconductor module of the present invention comprises a first conductive layer (film) and a second conductive layer (film) which are separately formed on the main surface of a packed substrate, a thermal diffusion plate connected by solder to the upper surface of the first conductive layer, a semiconductor element connected by solder to the upper surface of the thermal diffusion plate, and a lead having one end connected by solder to the second conductive layer and the other end connected by solder to the semiconductor element, wherein the outer periphery of the connected region where the semiconductor element is connected by solder to the upper surface of the thermal diffusion plate is formed with protrusion parts protruding up from the connecting region and a turning of the semiconductor element in the upper surface of the thermal diffusion plate in the solder connecting process is suppressed by the protrusion parts.

8 Claims, 6 Drawing Sheets

POWER SEMICONDUCTOR MODULE

BACKGROUND OF THE INVENTION

1. Field of the Invention

The present invention relates to semiconductor modules and more particularly a packing structure that is preferable for a power semiconductor module used in a home appliance or industrial equipment.

2. Description of the Related Art

In the case of a power semiconductor element module used in home appliances or automobile control equipment or the like (for example, an insulated gate bi-polar transistor (hereinafter called as IGBT), it is general to employ a structure having the power semiconductor element connected with wirings on a high thermal conductive ceramic substrate by hot thermal conductor material such as solder and the like in order to increase a thermal radiation characteristic. However, in view of the fact that although the ceramic substrate shows a high thermal conduction, its cost is high, a structure having a metallic substrate is used, the metallic substrate having thereon wirings connected under application of resin of relative high thermal conduction efficiency to a metallic plate of Al (aluminum) or Cu (copper) and the like. When the aforesaid metallic substrate is used, it is also proposed to employ a structure having a thermal diffusion plate held between the power semiconductor element and the wiring so as to improve a thermal radiation characteristic of the power module.

Japanese Patent Laid-Open No. 2001-110957 (Japanese Patent No. 3627591) (Patent Document 1) discloses a method for manufacturing a power semiconductor module using the metallic substrate. In accordance with this Patent Document 1, both a semiconductor chip 1 and a thermal diffusion plate 3 are connected by hot solder 105 of a melting point of 270° C. or higher within a reducing atmosphere furnace. A lead frame 2 and an electrode surface are also connected with a hot solder 104. Thereafter the thermal diffusion plate 3 and a first conductive layer (film) 41 on the wiring substrate are connected by a solder 106 of low temperature, and the lead frame 2 and a second conductive layer (film) 42 on the wiring substrate are connected by a solder 107 of low temperature (see FIG. 8). According to the structure described in Patent Document 1, since the lead frame 2 is used as the wiring, the electrical resistance value of the wiring can be reduced. In addition, Patent Document 1 describes that a wire bonding can be eliminated because the lead frame 2 is connected by solder within the reducing atmosphere furnace, and that the lead frame 2 can assist a function of the thermal diffusion plate.

SUMMARY OF THE INVENTION

However, since both solder of high temperature and solder of low temperature are used at the junction part in the method of Japanese Patent Laid-Open No. 2001-110957 (Japanese Patent No. 3627591), it becomes necessary to attain at least twice of thermal history for performing the soldering connection work and its process becomes complicated. In addition, since the lead frame, the semiconductor chip and the thermal diffusion plate are connected with the same solder of high temperature, the semiconductor chip located at the intermediate part generates a positional displacement when the solder is melted.

It is an object of the present invention to provide a thermal diffusion plate structure of the power semiconductor module enabling its bulk connection with the same material and the power semiconductor module eliminating the aforesaid disadvantages of the conventional technique and suppressing a positional displacement between the semiconductor chip and the thermal diffusion plate.

The semiconductor module (power semiconductor module) in accordance with the present invention comprises a substrate having a main surface on which a first conductive layer (a first conductive film) and a second conductive layer (a second conductive film) are separately formed, a semiconductor element fixed on the first conductive layer and electrically connected on the first conductive layer and a lead electrically connecting the second conductive layer with the semiconductor element, wherein a thermal diffusion plate made of either metal or alloy is arranged between the upper surface of the first conductive layer and the lower surface of the semiconductor element; and the thermal diffusion plate having some protrusions protruding from a junction region is used at a peripheral edge region nearer to the end part of the upper surface of the thermal diffusion plate than to the junction region where the lower surface of the semiconductor element is connected with the upper surface of the thermal diffusion plate to control a positional displacement between the semiconductor chip and the thermal diffusion plate when they are connected.

Its typical structure will be described as follows.

Structure 1: A semiconductor module comprising a substrate having a main surface on which a first conductive layer and a second conductive layer are separately formed, a semiconductor element arranged on the upper surface of the first conductive layer and electrically connected to the first conductive layer, and a lead for electrically connecting the second conductive layer with the semiconductor element, wherein a thermal diffusion plate made of metal or alloy is arranged between the upper surface of the first conductive layer and the lower surface of the semiconductor element, and the thermal diffusion plate is formed with protrusion parts.

Structure 2: in the structure 1, the upper surface of the thermal diffusion plate and the lower surface of the semiconductor element face each other and the semiconductor element is connected to the upper surface of the thermal diffusion plate.

Structure 3: in the structure 2, the protrusion parts are formed on said upper surface of said thermal diffusion plate at locations (positions) nearer to end portions than to a region where the semiconductor element is connected with the upper surface of the thermal diffusion plate.

Structure 4: in the structure 2, further protrusions are formed on the upper surface and a lower surface of said thermal diffusion plate.

Structure 5: a semiconductor module comprising a thermal diffusion plate, a substrate having a main surfaces on which a first conductive layer and a second conductive layer are separately formed, a semiconductor element fixed to the first conductive layer and electrically connected to the first conductive layer, and a lead electrically connecting the second conductive element with the semiconductor element, wherein a thermal diffusion plate made of metal or alloy is arranged between the upper surface of the first conductive layer and the lower surface of the semiconductor element; and a peripheral region on the upper surface of the thermal diffusion plate nearer to end portion than to a connecting region where the upper surface of the thermal diffusion plate and the lower surface of the semiconductor element are connected, is formed with protrusion parts protruding up from the connecting region.

Structure 6: in the structure 5, the lead and the semiconductor element, the semiconductor element and the thermal diffusion plate, the thermal diffusion plate and the first conductive layer, and the lead and the second conductive layer in the structure 5 are connected by the same solder material or solder paste, or solder material or solder paste that enables bulk connection.

Structure 7: in the structure 5, the upper surface or lower surface of the thermal diffusion plate is formed with further protrusions other than said protrusion parts.

Structure 8: in the structure 5, either the upper surface of the semiconductor module or the upper surface and a part of the lower surface of the semiconductor module is covered by filled resin.

According to the present invention as explained above, in the semiconductor module, in particular, the power semiconductor module, a positional displacement between the semiconductor chip and the thermal diffusion plate at the time of melting can be suppressed and simultaneously a soldering thickness can also be controlled in reference to the shape of the thermal diffusion plate. With such an arrangement as above, it is possible to realize a bulk connection with the same material and a low-cost semiconductor module can be provided.

DESCRIPTION OF THE PREFERRED EMBODIMENTS

The preferred embodiment of the present invention will be described in detail with reference to the accompanying drawings.

First Embodiment

Figure 1:
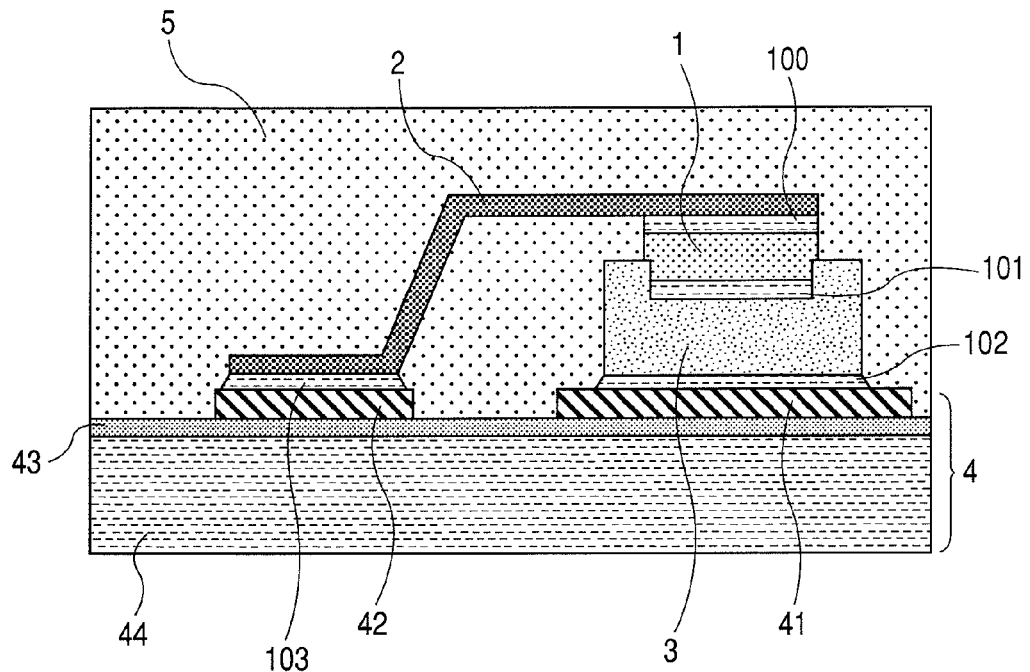
FIG. 1 is a schematic side elevational view showing the semiconductor module according to the first embodiment of the present invention.

FIG. 1 is a schematic section view showing a part near the semiconductor element (the power device) of the semiconductor module (power semiconductor module) according to a first embodiment of the present invention. In FIG. 1, reference numeral 1 denotes a semiconductor chip; 2, a lead frame (formed by folding a flat metallic plate, for example); 3, a thermal diffusion plate; 4, a metallic substrate; 5, a filled resin; 41, a first conductive layer (a first conductive film); 42, a second conductive layer (a second conductive film); 43, a resin insulation layer; 44, a metallic plate; 100, a solder on the chip; 101, a solder on the thermal diffusion plate; 102, a solder on the first conductive layer; and 103, a solder on the second conductive layer.

Figure 2A:
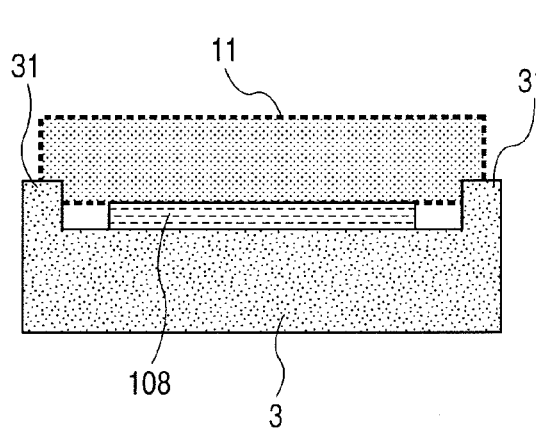
FIGS. 2(a) and 2(b) are a sectional view and a top plan view schematically showing a first shape of the thermal diffusion plate according to the first embodiment of the present invention.
Figure 2B:
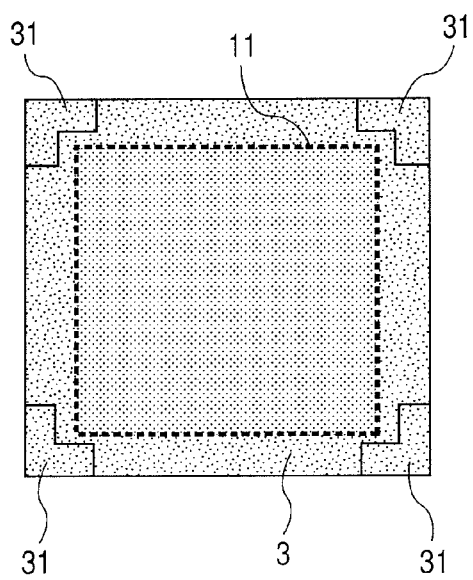
Figure 2B:

FIGS. 2(a) and 2(b) illustrate one example of the shape (hereinafter called as a first shape) of the thermal diffusion plate 3 devised by the present inventors so as to suppress a positional displacement between the semiconductor chip 1 and the thermal diffusion plate 3 and make a bulk connection of all the constituent elements of the semiconductor module through a solder of either the same material or material showing a near melting point. The semiconductor chip 1 mounted on the thermal diffusion plate 3 is illustrated in a pattern enclosed by a dotted line as its chip size 11. That is, in view of a possibility that the semiconductor chip 1 mounted on the main surface (upper surface) of the thermal diffusion plate 3 is turned within the main surface, FIGS. 2(a) and 2(b) do not show that the semiconductor chip 1 is connected by solder to the thermal diffusion plate 3, but show a relation of relative sizes of the semiconductor chip 1 and the thermal diffusion plate 3 as one example of arrangement of the semiconductor chip that could be seen before it. This thermal diffusion plate 3 has a larger size than the chip size 11 and as shown in FIG. 2(b), its upper surface is wider than the lower surface (one of the main surfaces) of the semiconductor chip 1 connected to it with solder. Further, the peripheral region (peripheral portion) enclosing the chip size 1 at the main surface of the thermal diffusion plate 3 is provided with the protrusion parts 31 for every corner at the main surfaces.

The method for manufacturing a semiconductor module in accordance with the first embodiment of the present invention will be described as follows.

At first, each of a first conductive layer 41 and a second conductive layer 42 is connected by a resin insulation layer 43 to each of portions of the main surface of a metallic plate 44 corresponding to a region for mounting a lead frame 2 and a region for mounting a thermal diffusion plate 3 on a metallic substrate (a packing substrate) 4. Then, solder 102 is supplied to the upper surface of the first conductive layer 41 and solder 103 is supplied on the second conductive layer 42, respectively, with solder paste or solder sheet or solder plating or the like. A method for supplying solders 102, 103 may be any of a printing method, mounting of the solder sheet and plating method or the like. The first conductive layer 41, second conductive layer 42 and metallic plate 44 are made of either metals such as aluminum, nickel, iron or copper or their alloy. As solder material, it is satisfactory that lead-free solder represented by Sn-3Ag-0.5Cu solder, for example, is applied. The thermal diffusion plate 3 is mounted on the solder 102 on the first conductive layer 41 formed in this way.

Referring to FIGS. 2(a) and 2(b), the thermal diffusion plate 3 having the aforesaid first shape will be described. FIG. 2(a) is a side elevational view as seen from a direction A of the thermal diffusion plate 3 where a flat plane structure (a main surface) is shown in FIG. 2(b). The thermal diffusion plate 3 is made of copper, copper alloy, copper-molybdenum alloy or the like. In order to improve wetness of solder to the thermal diffusion plate 3, it may also be applicable that at least one layer of tin, solder, nickel or alloy is formed through plating or vapor deposition or sputtering or the like. After mounting the thermal diffusion plate 3, solder 101 on the thermal diffusion plate 3 is formed by solder sheet, solder paste and solder dipping or the like. As the solder 101 on the thermal diffusion plate 3, the same material as that of solder 102 on the first conductive layer 41 or solder applied as the solder 103 on the second conductive layer 42 or material having a near melting temperature is selected. In the case that solder 101 is supplied on the thermal diffusion plate 3 through the solder sheet, coating of flux to either the upper surface of the thermal diffusion plate 3 or the solder 101 on the thermal diffusion plate 3 improves wetness of the solder. In this case, although the example in which the solder 101 on the thermal diffusion plate 3 is formed after mounting the thermal diffusion plate 3 on the metallic substrate 4 has been illustrated, the solder 101 may be formed on the thermal diffusion plate 3 before the thermal diffusion plate 3 is mounted on the metallic substrate 4.

Subsequently, the semiconductor chip 1 is mounted on the solder 101 on the thermal diffusion plate 3 and further the solder 100 is formed on the semiconductor chip 1 with the solder sheet or solder paste or solder dipping or the like. As the solder 100 on this semiconductor chip 1, either the same material as that of solder applied in the solder 102 on the first conductive layer 41 or solder 103 on the second conductive layer 42 or material with near melting point is selected. In the case that the solder 100 is supplied through the solder sheet, coating of plastic material on either the upper surface of the semiconductor chip 1 or the lead frame 2 improves wetness characteristic of the solder. The metallic film for assuring a wetness characteristic of solder, and at least one of the layers of titanium, nickel, gold, copper, silver and tin or the like, for example, are formed at the semiconductor chip 1. Lastly, the lead frame 2 formed by copper, copper alloy or copper-molybdenum alloy or the like is mounted on the solder 103 on the second conductive layer 42 and the solder 100 on the chip. In order to improve a wetness characteristic of solder in respect to the lead frame 2, it may also be applicable that at least one layer of tin, solder, nickel or gold and the like is formed at the lead frame 2 through plating, vapor deposition and sputtering or the like. After the element up to the lead frame 2 is mounted, the solder 100 on the chip, solder 101 on the thermal diffusion plate, solder 102 on the first conductive layer and solder 103 on the second conductive layer are melted and totally connected. In the case of Sn-3Ag-0.5Cu solder, the connecting temperature is about 240° C. to 260° C. Lastly, either a part of or entire structure is sealed with filling resin 5 to complete the semiconductor module of the preferred embodiment of the present invention. The filling resin 5 may be any of gel and mold resin.

In the present embodiment, the structure (including either the semiconductor chip 1 or the lead frame 2) forming a hierarchical connection on the metallic plate (a packed substrate) 44 can be collectively connected with solder and a soldering connection reliability is improved by covering the solder connecting part with the filling resin 5. In addition, since an expensive ceramic substrate is not used at the packed substrate, its cost can be reduced. Further, the structure of the semiconductor module according to the present embodiment of the present invention can be realized by a method other than the aforesaid manufacturing process as one preferable example.

When the solder is melted at the time of bulk connection of the aforesaid structure, the solder 100 on the semiconductor chip 1, the solder 101 on the thermal diffusion plate 3, the solder 102 on the first conductive layer 41 and the solder 103 on the second conductive layer 42 are melted in a substantially simultaneous manner, so that there occurs a possibility that positions of the thermal diffusion plate 3, semiconductor chip 1 and lead frame 2 are displaced to each other due to discharging of voids during these melting operations and injection of flux or solvent in the paste. However, as to the positional displacement between the lead frame 2 and the thermal diffusion plate 3, it can be prevented by restricting the solder wet regions on the first conductive layer 41 and the second conductive layer 42 with a mask (for example, resist). However, in order to make a countermeasure against the positional displacement between the thermal diffusion plate 3 and the semiconductor chip 1 by a similar method, it becomes necessary to form a pattern for controlling the solder wet region at the thermal diffusion plate 3 and so the number of steps is substantially increased.

Thus, the present inventors have devised the first shape of the thermal diffusion plate shown in FIGS. 2(a) and 2(b) in order to prevent the positional displacement between the thermal diffusion plate 3 and the semiconductor chip 1. When the solder 108 melts at the connecting stage, the semiconductor chip 1 is apt to turn by a self-alignment force of the solder 108 along with discharging of voids and injection of the solvent in the flux or solder paste. However, since the turning of the semiconductor chip 1 within the main surface (upper surface) of the thermal diffusion plate 3 is physically suppressed with protrusion parts 31, the positional displacement of the semiconductor chip 1 on the thermal diffusion plate 3 can be prevented. It is sufficient that a protrusion height of the protrusion parts 31 at this time is lower than a sum of thicknesses of the semiconductor chip 1 and the solder 108 and higher than a thickness of the solder 108. In FIG. 2(b), although the shape of the protrusion parts 31 in the main surface of the thermal diffusion plate 3 is shown as an L-shape, the shape can be changed into a circular column or rectangular column or triangular pyramid as long as the turning of the semiconductor chip 1 can be suppressed. In addition, forming the protrusion parts 31 near the corners (four corners, for example) eliminates a necessity to adjust the mounting positions of the solder 108 and semiconductor chip 1 into the main surface of the thermal diffusion plate 3 under a high precision and then a void removing characteristic at the central part of the side of the semiconductor chip 1 is improved.

In addition, it is also applicable that at least three protrusion parts 31 are separated with each other at the peripheral edge enclosing a chip size 11 (the mounting region of the semiconductor chip 1) in the main surface of the thermal diffusion plate 3. It is preferable that when the main surface of the thermal diffusion plate 3 is formed into a rectangular shape, a pair of two of three protrusion parts 31 is arranged near four corners of the main surface and a remaining one protrusion part is arranged at another side opposing against a side connecting a pair of corners in the rectangular main surface and it is also desirable that the remaining protrusion part 31 is mounted at a position spaced apart from both ends of the other side (a neutral point, for example). It is also applicable that an additional protrusion part 31 is arranged at three protrusion parts 31 arranged in this way or four protrusion parts each of which is arranged at four corners in the rectangular main surface.

As a method for forming the protrusion parts 31, it may be applicable to employ a mechanical process such as a pressing process or a cutting process of the thermal diffusion plate 3 (raw materials), chemical process such as plating or etching, or casting process. The pressing process is suitable in view of easiness in making and low cost.

Figure 3A:
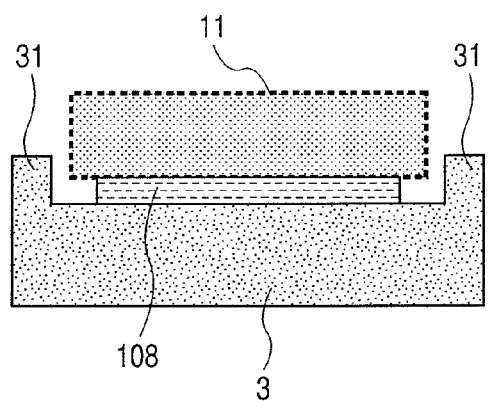
FIGS. 3(a) and 3(b) are a sectional view and a top plan view schematically showing a second shape of the thermal diffusion plate according to the first embodiment of the present invention.
Figure 3B:
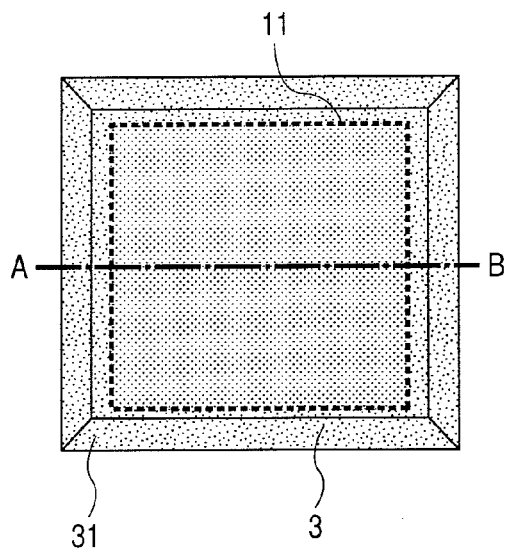

In FIGS. 3(a) and 3(b) are illustrated another shape (hereinafter called as a second shape) of the thermal diffusion plate 3 devised by the present inventors. FIG. 3(a) is a sectional view taken along line A-B of FIG. 3(b). This thermal diffusion plate 3 is provided with protrusion parts 31 in which a size of the main surface is larger than a chip size (a size at the main surface of the semiconductor chip 1) 11 and at the entire outer peripheral region of the thermal diffusion plate near the outer peripheral region of the chip size 11. It is satisfactory that a protrusion height of the protrusion parts 31 at this time is lower than a sum of thicknesses of the semiconductor chip 1 and the solder 108 and higher than a thickness of the solder 108. In FIGS. 3(a) and 3(b), although the protrusion parts 31 are shown to be formed into a so-called wall shape over the entire outer peripheral region at the main surface of the thermal diffusion plate 3, it may also be applicable that a plurality of protrusion parts 31 with shapes of circular column, rectangular column, triangular pyramid are arranged to enclose the outer periphery of the main surface at the thermal diffusion plate 3 as long as the protrusion parts suppress a turning of the semiconductor chip 1. Positional displacement of the semiconductor 1 at the main surface is suppressed by the thermal diffusion plate 3 having this second shape. In addition, a structure for enclosing the outer periphery at the main surface of the thermal diffusion plate 3 with the protrusion parts 31 eliminates a high precision adjustment of installing positions of the solder 108 and the semiconductor chip 1 at the main surface. Further, at the time of melting of the solder 108, overflow of the solder which is from the main surface of the thermal diffusion plate 3 to the side surfaces is suppressed.

As a method for forming the protrusion parts 31, it may be applicable to employ a mechanical process such as pressing process or cutting process, chemical process such as plating or etching, and casting process or the like. The pressing process is suitable in view of easiness in making and low cost.

Figure 4A:
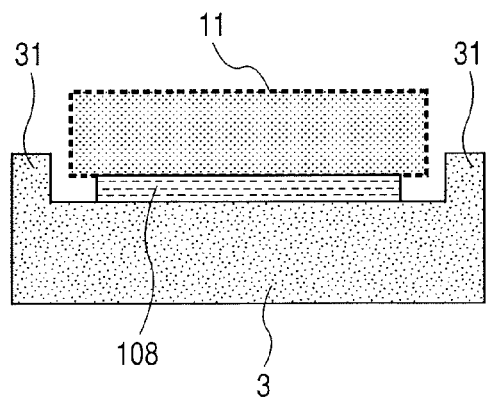
FIGS. 4(a) and 4(b) are a sectional view and a top plan view schematically showing a third shape of the thermal diffusion plate according to the first embodiment of the present invention.
Figure 4B:
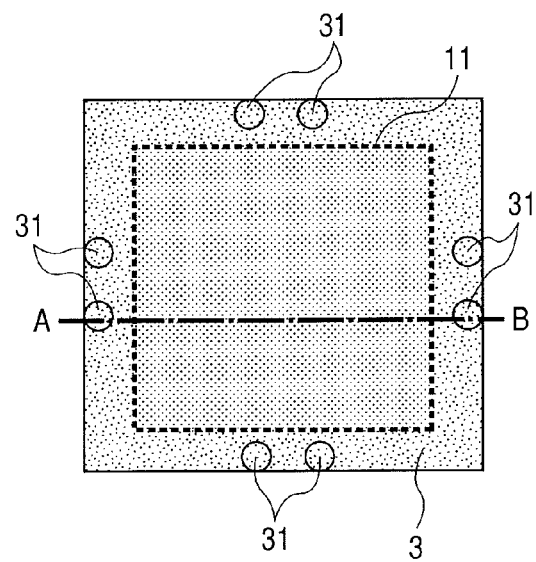

In FIGS. 4(a) and 4(b) are illustrated another shape of the thermal diffusion plate 3 (hereinafter called as a third shape) devised by the present inventors. FIG. 4(a) is a sectional view taken along line A-B of FIG. 4(b). A size of the main surface at the thermal diffusion plate 3 is larger than a chip size (a size at the main surface of the semiconductor chip) 11 and there are provided protrusion parts 31 near the central part in the region (the side in the main surface of the thermal diffusion plate 3, for example) positioned at outer periphery in the main surface of the thermal diffusion plate 3. It is satisfactory that a protrusion height of the protrusion parts 31 at this time is lower than a sum of thicknesses of the semiconductor chip 1 and the solder 108 and higher than a thickness of the solder 108. In FIGS. 3(a) and 3(b), although the circular column-like protrusion parts 31 are shown to be formed into rectangular column, triangular pyramid and corrugated shape or the like as long as the protrusion parts suppress a turning of the semiconductor chip 1 at the main surface of the thermal diffusion plate 3, it may also be applicable that the protrusions 31 are arranged near the central part of "side" defining the main surface in the thermal diffusion plate 3. Positional displacement of the semiconductor 1 at the main surface is suppressed by the thermal diffusion plate 3 having this third shape. In addition, forming the protrusion parts 31 near the central part of the side eliminates a high precision adjustment of installing positions of the solder 108 and the semiconductor chip 1 at the main surface of the thermal diffusion plate 3. Further, at the time of melting of the solder 108, the overflow of the solder to the side surfaces of the thermal diffusion plate 3 is suppressed and void removal characteristic (void removal efficiency) from a position near the corner at the main surface of the thermal diffusion plate 3 is improved.

As a method for forming the protrusion parts 31, it may be applicable to employ a mechanical process such as pressing process or cutting process, chemical process such as plating or etching, and casting or the like. The pressing process is suitable in view of easiness in making and low cost.

Figure 5A:
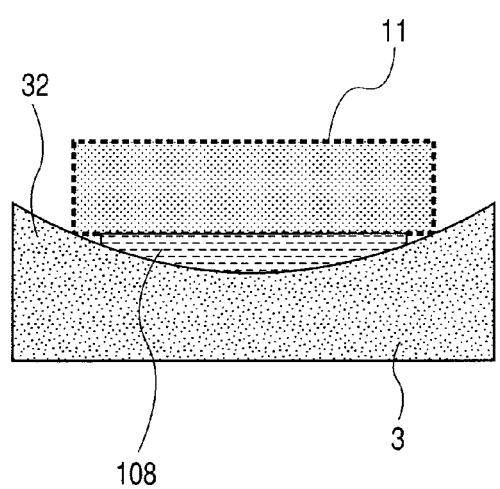
FIGS. 5(a) and 5(b) are a sectional view and a top plan view schematically showing one of fourth shapes of the thermal diffusion plate according to the first embodiment of the present invention.
Figure 5B:
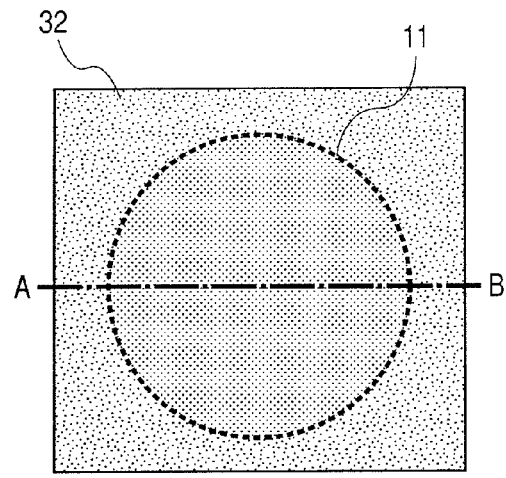
Figure 5C:
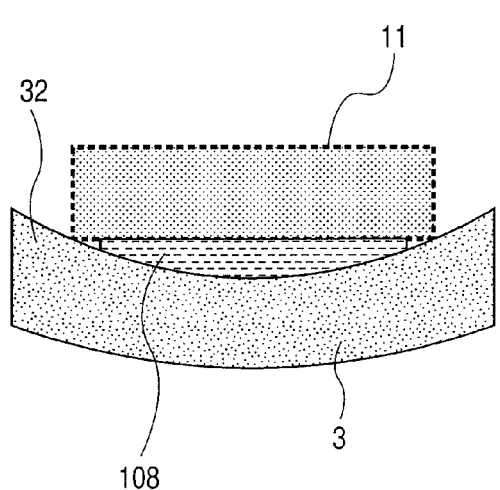
FIGS. 5(c) and 5(d) are a sectional view and a top plan view schematically showing other of fourth shapes of the thermal diffusion plate according to the first embodiment of the present invention.
Figure 5D:
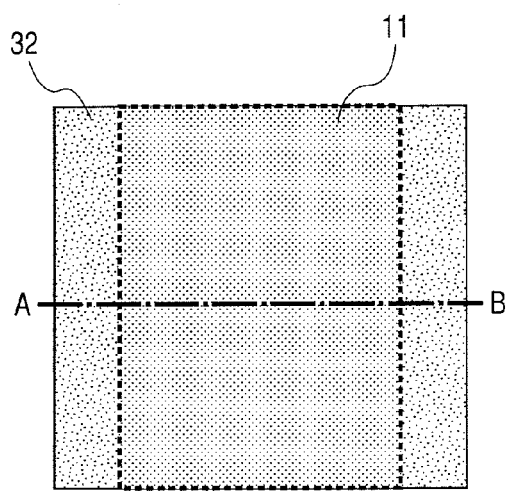

In FIGS. 5(a) through 5(d) are illustrated a yet further shape of the thermal diffusion plate 3 (hereinafter called as a fourth shape). Each of FIG. 5(a) and FIG. 5(c) is sectional views taken along line A-B of each of FIG. 5(b) and FIG. 5(d). The thermal diffusion plate 3 shown in FIG. 5(b) is formed with "dimple" at the central part of its upper surface. In turn, the thermal diffusion plate 3 shown in FIG. 5(d) is formed into a halfpipe shape and its part near the central part is dimpled along the one side. All these thermal diffusion plates 3 have a larger size than the chip size 11 in the same manner as that of the aforesaid thermal diffusion plate 3, wherein the four corners (FIG. 5(b)) at the outer peripheral region than the chip size 11 or the opposed two sides (FIG. 5(d)) have shapes protruding from the bottom surface of the semiconductor chip 1. It is satisfactory that a protrusion height of the protrusion 32 at this time is lower than the upper surface of the semiconductor chip 11 fixed to the thermal diffusion plate and higher than the bottom surface of the semiconductor chip 1. In FIGS. 5(b) and 5(d), although the dimple shape at the main surface of the thermal diffusion plate 3 is circular and a halfpipe shape, another shape may also be applicable if the central part (a part covered by the semiconductor chip 1) of the main surface of the thermal diffusion plate 3 is the lowest height. In addition to the fact that the positional displacement of the semiconductor chip 1 at the main surface is suppressed by the thermal diffusion plate 3 having the fourth shape, it does not need to adjust a mounting position of the solder 108 and semiconductor chip 1 to the main surface of the thermal diffusion plate 3. In addition, void removal characteristic of the solder 108 from the central part of the side in the main surface of the thermal diffusion plate 3 is improved. Further, an increased thickness of the solder 108 at the central part of the bottom surface (the lower surface) of the semiconductor chip 1 extends a solder connecting life time to the thermal diffusion plate 3.

As a method for forming the dimple (concave surface) at the main surface of the thermal diffusion plate 3 shown in FIGS. 5(b) and 5(d), although it may be applicable to employ a mechanical process such as pressing process or cutting process, chemical process such as plating or etching, and casting process or the like, the pressing process is suitable in view of easiness in making and low cost. Additionally, a large-sized metallic plate formed with a dimple or corrugation at its main surface is divided into a thermal diffusion plate size and the thermal diffusion plate 3 having the fourth shape can be easily attained by the pressing process.

Second Embodiment

Figure 6:
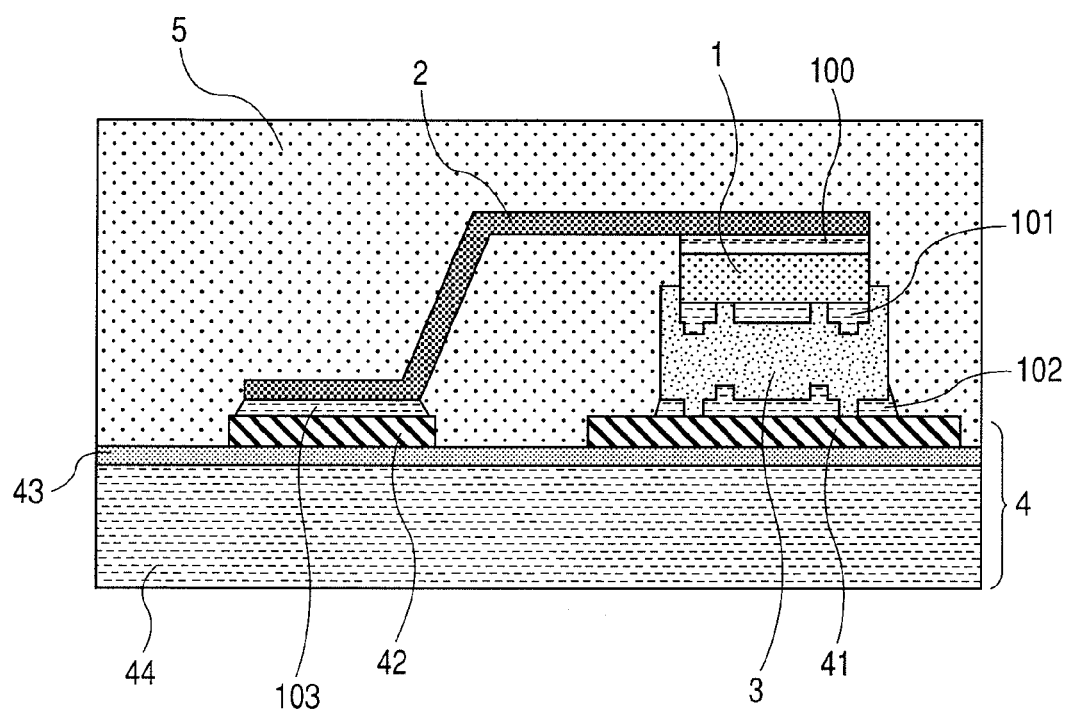
FIG. 6 is a schematic side elevational view showing the semiconductor module according to a second embodiment of the present invention.

FIG. 6 shows a schematic sectional view illustrating a location near the semiconductor element (power device) according to a second embodiment of the present invention. The semiconductor module according to the second embodiment is made such that a shape of at least one of the portion covered by the semiconductor chip 1 above the upper surface (one of the main surfaces) of the thermal diffusion plate 3 assembled into the semiconductor module and its lower surface (the other of the main surfaces) is different from that of the thermal diffusion plate 3 according to the first embodiment.

Figure 7A:
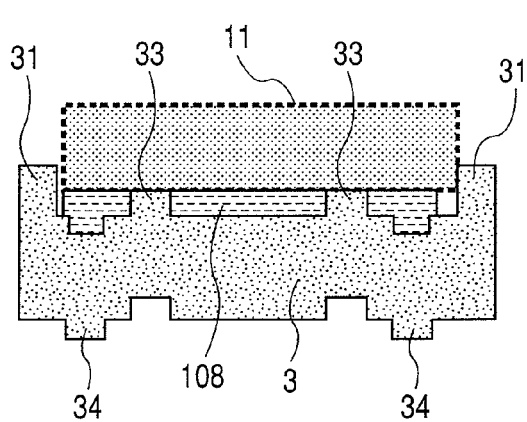
FIG. 7(a) is a sectional view showing the thermal diffusion plate according to a second embodiment of the present invention and FIGS. 7(b), 7(c) and 7(d) are a top plan view showing the thermal diffusion plate according to the second embodiment of the present invention.

FIG. 7(a) schematically shows in section the thermal diffusion plate 3 featuring the second embodiment. Each of the upper surface and lower surface of the semiconductor chip 1 is formed with protrusions 33, 34, respectively. Within the mounted region of the thermal diffusion plate 3, on which the semiconductor chip 1 is mounted, has concave parts opposing the protrusions 34 formed at the lower surface. Concave parts opposing the protrusions 33 are formed at the upper surface of the thermal diffusion plate 3.

Figure 7B:
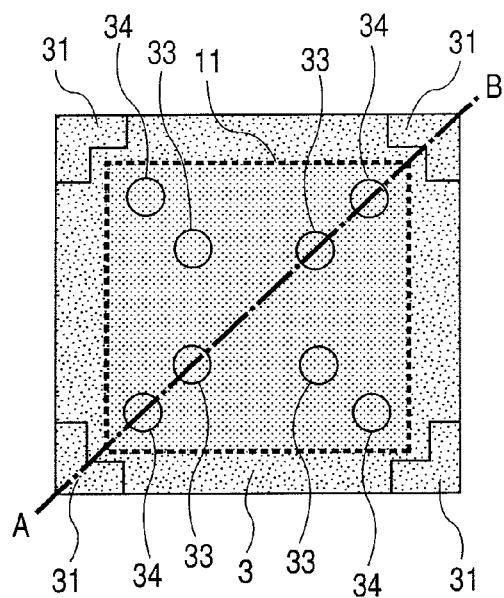
Figure 7C:
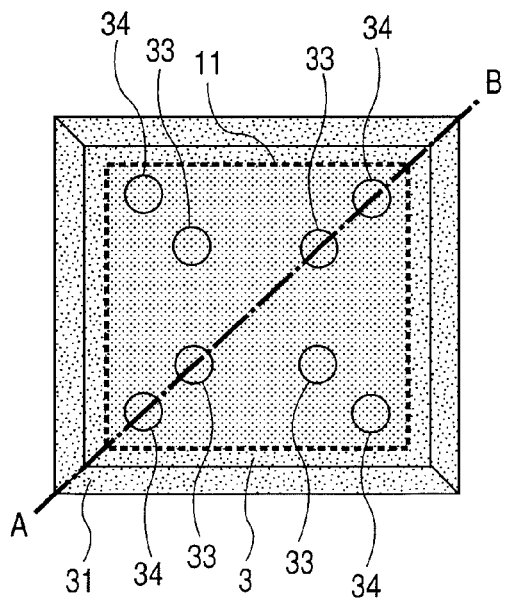
Figure 7D:
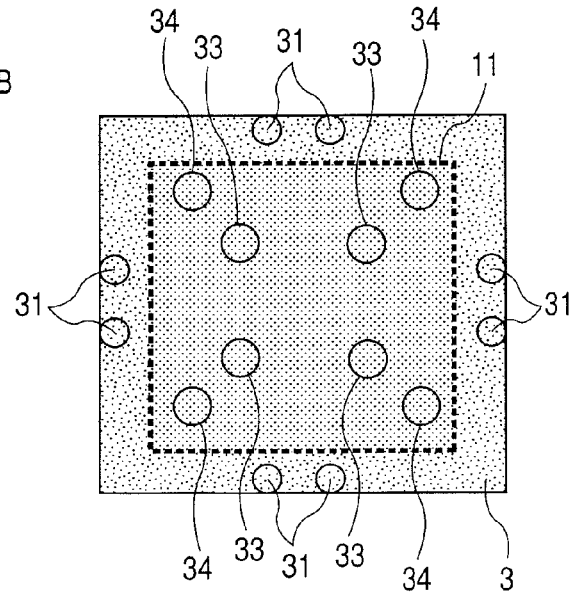
Figure 8:
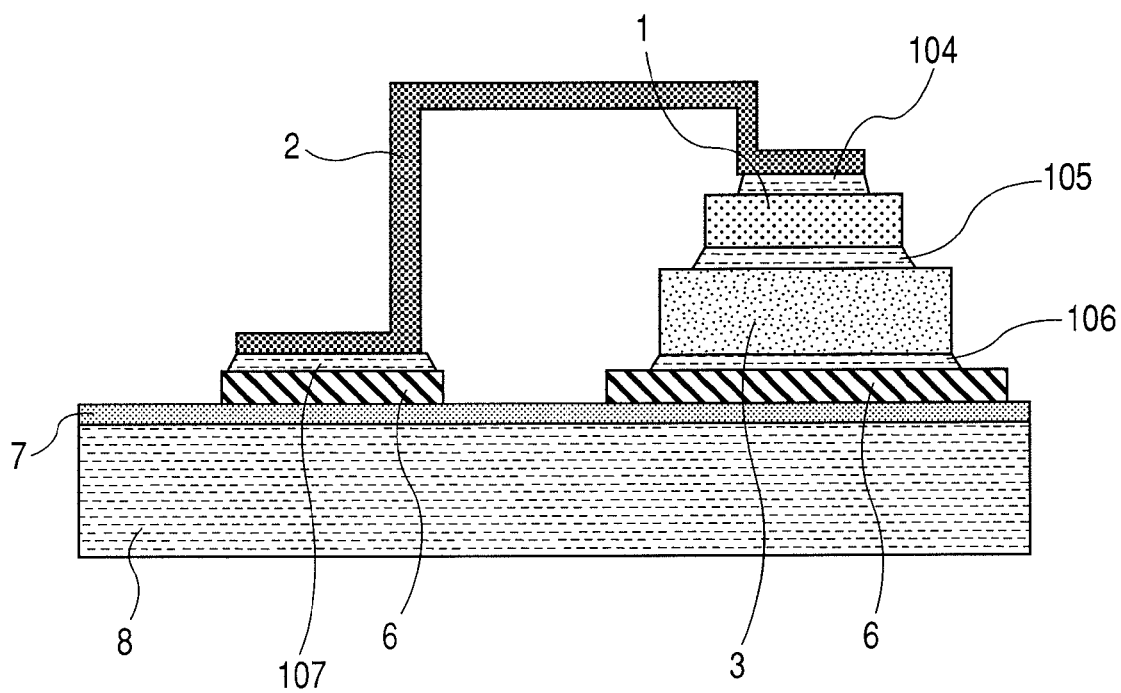
FIG. 8 is a schematic sectional view showing the conventional art power semiconductor module.

In FIGS. 7(b), 7(c) and 7(d) is illustrated a flat surface structure (upper surface) of the thermal diffusion plate 3 according to the second embodiment of the present invention, wherein each of them shows a structure in which the positional displacement between the semiconductor chip 1 and the thermal diffusion plate 3 described above in the first embodiment is suppressed and further constituent elements of the semiconductor module are collectively connected with the same material or solder material having a near melting point. That is, the thermal diffusion plate 3 in FIG. 7(b) has the aforesaid first shape, the thermal diffusion plate 3 in FIG. 7(c) has the aforesaid second shape and the thermal diffusion plate 3 in FIG. 7(d) has the aforesaid third shape, respectively. Also in the present embodiment, the size of the main surface of the thermal diffusion plate 3 is larger than the chip size 11 and the outer peripheral region enclosing the chip size 11 of the main surface is provided with the protrusion parts 31 of the aforesaid first shape, second shape or third shape.

In turn, the thicknesses of the solder 102 on the first conductive layer 41 and the solder 101 on the thermal diffusion plate are controlled by the protrusions 33, 34 formed in the mounting region of the semiconductor chip 1 of the thermal diffusion plate 3 and its lower surface. The protrusions 33, 34 formed on at least one of the upper surface and lower surface of the thermal diffusion plate 3 are also called as "solder thickness controlling protrusions" in reference to their functions and they are classified into the upper surface solder thickness controlling protrusions 33 and the lower surface solder thickness controlling protrusions 34.

A method for manufacturing the semiconductor module in the present embodiment will be described as follows.

At first, each of the first conductive layer 41 and the second conductive layer 42 is connected by the resin insulation layer 43 at the main surface of the metallic plate 44 becoming the lead frame 2 mounting region and the thermal diffusion plate 3 mounting region of the metallic substrate (packed substrate) 4. Then, each of the solder 102 and solder 103 is supplied to the upper surface of the first conductive layer 41 and onto the second conductive layer 42, respectively, through solder paste, solder sheet and solder plating or the like. A method for supplying the solders 102, 103 may be performed by any of a printing method, solder sheet mounting method and plating method or the like. The first conductive layer 41, second conductive layer 42 and metallic plate 44 are made of metals or their alloy such as aluminum, nickel, iron or copper. It is preferable to use lead-free solder represented by Sn-3Ag-0.5Cu solder, for example, as solder material. The thermal diffusion plate 3 is mounted on the solder 102 on the first conductive layer 41 formed in this way. In FIGS. 7(a) through 7(d) is illustrated one example of the shape of the thermal diffusion plate 3.

FIG. 7(a) is a sectional view taken along line A-B of FIG. 7(b) and FIG. 7(c). The thermal diffusion plate 3 is made of copper, copper alloy or copper-molybdenum alloy and the like and it may also be applicable that at least one layer of tin, solder, nickel or gold is formed on the surface of the thermal diffusion plate through plating or vapor deposition or solder dipping and the like in order to improve a wetness characteristic of solder against the surface. After the thermal diffusion plate 3 is mounted on the first conductive layer 41 (solder 102), solder 101 is formed on the upper surface of the thermal diffusion plate 3 through solder sheet, solder paste and solder dipping or the like. As the solder 101 on the thermal diffusion plate 3, the solder 102 on the first conductive layer 41, the same material as that of the solder 102 on the first conductive layer 41 or the solder 103 on the second conductive layer 42 or the material having a near melting point is selected. In the case that the solder 101 on the thermal diffusion plate 3 is supplied as a solder sheet, coating of flux on either the upper surface of the thermal diffusion plate 3 or the solder 101 on the thermal diffusion plate 3 causes a wetness characteristic of solder to be improved. In the present embodiment, although the example in which the solder 101 is formed on the thermal diffusion plate 3 after the thermal diffusion plate 3 is installed on the metallic substrate 4 (metallic plate 44) has been disclosed, it may also be applicable that the solder 101 is formed on the thermal diffusion plate 3 before its mounting on the metallic substrate 4.

Subsequently, the semiconductor chip 1 is mounted on the solder 101 on the thermal diffusion plate 3, and further the solder 100 is formed on the semiconductor chip 1 through the solder sheet, solder paste and solder dipping or the like. As the solder 100 on the semiconductor chip 1, the same material as that of the solder 102 on the first conductive layer 41 or the solder 103 on the second conductive layer 42 or material showing a near melting point is selected in the same manner as that of the solder 101 on the thermal diffusion plate 3. In the case that the solder 100 is supplied as the solder sheet, flux is coated to the upper surface of the semiconductor chip 1 or the surface of the lead frame 2 to improve a wetness characteristic of solder to the surface.

The metallic film for assuring a wetness characteristic of solder, for example, at least one layer of titanium, nickel, gold, copper, silver and tin is formed at the semiconductor chip 1 according to the second embodiment of the present invention. Lastly, the lead frame 2 (for example, both ends of it) formed by copper, copper alloy or copper-molybdenum alloy and the like is mounted on the solder 103 on the second conductive layer 42 and the solder 100 on the semiconductor chip 1. In order to improve a wetness characteristic of solder to the lead frame 2, it may also be applicable that at least one layer of tin, solder, nickel and gold is formed at the lead frame 2 through plating or vapor deposition and sputtering or the like. Solder 100 on the semiconductor chip 1, solder 101 on the thermal diffusion plate 3, solder 102 on the first conductive layer 41 and solder 103 on the second conductive layer 42 are melted through reflow at a stage where the lead frame 2 is mounted at the metallic substrate 4 to make a bulk connection of the constituent elements (the semiconductor chip 1, lead frame 2 and the like) on the metallic substrate 4 forming the structure of the semiconductor module. In the case of Sn-3Ag-0.5Cu solder, a connecting temperature is about 240° C. to 260° C. Lastly, either a part of the structure or entire structure is sealed with filling resin 5 to complete the semiconductor module of this preferred embodiment (preferred embodiment 2). The filling resin 5 may be of any of mold resins.

In the present embodiment, the structure of the semiconductor module having a hierarchical connection can be collectively connected. Reliability of a solder connection between the constituent elements of the semiconductor module is improved by covering the solder connecting part with the filling resin 5. In addition, since an expensive ceramic substrate is not used as a packed substrate, a low cost formation of the semiconductor module can be attained. The semiconductor module in accordance with the present embodiment is not limited to one example of preferable manufacturing stage illustrated as above, but it may also be realized by a manufacturing process other than the above processes.

When melting of solder when the aforesaid structure is collectively connected, the solder 100 on the semiconductor chip 1, solder 101 on the thermal diffusion plate 3, solder 102 on the first conductive layer 41 and solder 103 on the second conductive layer 42 are melted in a substantial simultaneous manner. Thus, the void discharging and injection of solvent within the flux or solder paste and the like may cause the positions of the thermal diffusion plate 3, semiconductor chip 1 and the lead frame 2 to be displaced to each other. However, in order to make a countermeasure against the positional displacement between the thermal diffusion plate 3 and the semiconductor chip 1 with a similar method, the thermal diffusion plate 3 requires to form a pattern for controlling the solder wetness region and the number of steps is remarkably increased.

In view of the above, the present embodiment may also prevent a positional displacement between the thermal diffusion plate 3 and the semiconductor chip 1 and control thicknesses of the solder 102 on the first conductive layer 41 and the solder 101 on the thermal diffusion plate 3. The thermal diffusion plate 3 shown in FIG. 7(b) is provided with the first shape (FIGS. 2(a) and 2(b)) at its upper surface, which has been described in the first embodiment, for the former purpose, and as for the latter purpose, the thermal diffusion plate 3 is formed with each of the upper surface side solder thickness controlling protrusions 33 at its upper surface and each of the lower surface side solder thickness controlling protrusions 34 at its lower surface.

In the solder connecting process, the semiconductor chip 1 is apt to turn by a self-alignment force of the solder 108 as the void is discharged out of the melted solder 108 and the solvent in the solder paste is injected. However, since the turning of the semiconductor chip 1 is physically suppressed by the protrusion parts 31, it is possible to prevent a positional displacement of the semiconductor chip 1. It is satisfactory that the height of the protrusion parts 31 protruding from the main surface of the thermal diffusion plate 3 is lower than a sum of thicknesses of the semiconductor chip 1 and the solder 108 and higher than the thickness of the solder 108. Although L-shaped protrusion parts 31 are shown in FIG. 7(b), it is also applicable that the protrusions 31 are formed into other shapes such as a circular column or rectangular column, triangle pyramid and the like as long as they suppress a turning of the semiconductor chip 1. In addition, forming the protrusion parts 31 near the corners does not require any adjustment for the mounting positions of the solder 108 and the semiconductor chip 1 onto the main surface of the thermal diffusion plate 3 under a high precision and causes the void of the solder 108 to be easily discharged out of the central parts of the sides of the semiconductor chip 1. In addition, forming the upper surface side solder thickness controlling protrusions 33 and the lower surface side solder thickness controlling protrusions 34 causes thicknesses of the solder 101 on the thermal diffusion plate 3 and the solder 102 on the first conductive layer 41 to be totally controlled and inclination of the semiconductor chip 1 in respect to the main surface of the thermal diffusion plate 3 to be reduced. Heights of the upper surface side solder thickness controlling protrusions 33 and the lower surface side solder thickness controlling protrusions 34 can be determined in reference to the thicknesses desired for the solder 101 and the solder 102. However, it is necessary for the heights of the upper surface side solder thickness controlling protrusions 33 in respect to the main surface of the thermal diffusion plate 3 to be lower than that of the protrusion parts 31.

As a method for forming the protrusion parts 31, a mechanical process such as a pressing process or cutting process, chemical process such as plating or etching, or casting process can be applied. In view of easiness in manufacturing and low cost, a pressing process is suitable for a formation of the protrusion parts 31. In addition, the upper surface side solder thickness controlling protrusions 33 and the lower surface side solder thickness controlling protrusions 34 can be simultaneously formed with the protrusion parts 31. In the present embodiment, although the upper surface side solder thickness controlling protrusions 33 and the lower surface side solder thickness controlling protrusions 34 are formed on the orthogonal lines of rectangular surface of the thermal diffusion plate 3, forming positions of these solder thickness controlling protrusions 33, 34 are not specifically restricted if they are places except a portion where the protrusion parts 31 at the main surface in the thermal diffusion plate 3 are formed.

In FIG. 7(c) is illustrated a flat surface structure of the thermal diffusion plate 3 having, at its upper surface, the protrusion parts 31 of the second shape (refer to FIGS. 3(a) and 3(b)) and the upper surface side solder thickness controlling protrusions 33 described in the preferred embodiment 1, and having, at its lower surface, the lower surface side solder thickness controlling protrusions 34. In the solder connecting process, the semiconductor chip 1 is apt to turn by a self-alignment force of the solder 108 due to the void discharging from the solder 108 accompanied by melting of the solder 108 or injection of solvent in the flux or solder paste. However, since the turning of the semiconductor chip 1 is physically suppressed by the protrusions 31, it is possible to prevent the positional displacement of the semiconductor chip 1. It is satisfactory that the protruding height of the protrusions 31 in respect to the main surface of the thermal diffusion plate 3 is lower than a sum of thicknesses of the semiconductor chip 1 and the solder 108 and higher than a thickness of the solder 108. In FIG. 7(c), the protrusion parts 31 extend continuously over an entire periphery of the main surface of the thermal diffusion plate 3 and show a so-called frame (or wall-like shape). However, the shape of the protrusion parts 31 is not limited as long as the turning of the semiconductor chip 1 is suppressed, and it is satisfactory that the outer periphery of the main surface of the thermal diffusion plate 3 is enclosed by a plurality of protrusion parts 31 formed into such shapes as a circular column, triangular pyramid and the like, for example.

The thermal diffusion plate 3 has the second shape to cause the positional displacement of the semiconductor chip 1 within the main surface to be suppressed. Enclosing of the outer periphery (circumferential edge) of the main surface at the thermal diffusion plate 3 with the protrusions 31 eliminates a necessity for performing an adjustment of the mounting positions of the solder 108 and the semiconductor chip 1 to the main surface of the thermal diffusion plate 3 under a high precision. In addition, overflow of the solder toward the side surface of the thermal diffusion plate 3 is suppressed at the time of melting of the solder 108. Further, forming the upper surface side solder thickness controlling protrusions 33 and the lower surface side solder thickness controlling protrusions 34 causes the thicknesses of the solder 101 on the thermal diffusion plate 3 and the solder 102 on the first conductive layer 41 to be collectively controlled and inclinations of the thermal diffusion plate 3 and the semiconductor chip 1 to be reduced. Heights of the upper surface side solder thickness controlling protrusions 33 and the lower surface side solder thickness controlling protrusions 34 can be determined in reference to thicknesses desired for the solder 101 and solder 102. However, it is necessary that the height of the upper surface side solder thickness controlling protrusions 33 in respect to the main surface of the thermal diffusion plate 3 is lower than that of the protrusion parts 31.

As a method for forming the protrusion parts 31, a mechanical process such as a pressing process or cutting process, chemical process such as plating or etching, or casting process can be applied. In view of easiness in manufacturing and low cost, a pressing process is suitable for a formation of the protrusion parts 31. In addition, the upper surface side solder thickness controlling protrusions 33 and the lower surface side solder thickness controlling protrusions 34 can be simultaneously formed with the protrusion parts 31. In the present embodiment, although the upper surface side solder thickness controlling protrusions 33 and the lower surface side solder thickness controlling protrusions 34 are formed on the orthogonal lines of rectangular surface of the thermal diffusion plate 3, forming positions of these solder thickness controlling protrusions 33, 34 are not specifically restricted if they are places except a portion where the protrusion parts 31 at the main surface in the thermal diffusion plate 3 are formed.

In FIG. 7(d) is illustrated a flat surface structure of the thermal diffusion plate 3 having, at its upper surface, the protrusion parts 31 of the third shape (refer to FIGS. 4(a) and 4(b)) and the upper surface side solder thickness controlling protrusions 33 described in the first embodiment, and having, at its lower surface, the lower surface side solder thickness controlling protrusions 34. In the solder connecting process, the semiconductor chip 1 is apt to turn by a self-alignment force of the solder 108 due to the void discharging from the melted solder 108 or injection of solvent in the flux or solder paste. However, since the turning of the semiconductor chip 1 is physically suppressed by the protrusion parts 31, it is possible to prevent the positional displacement of the semiconductor chip 1. It is satisfactory that the protruding height of the protrusion parts 31 protruding from the main surface of the thermal diffusion plate 3 is lower than a sum of thicknesses of the semiconductor chip 1 and the solder 108 and higher than a thickness of the solder 108. Although the circular column protrusion parts 31 are illustrated in FIG. 7(d), the protrusion parts 31 are formed into such shapes as a rectangular column, triangular pyramid, corrugated shape and the like as long as the turning of the semiconductor chip 1 is suppressed, and it is also satisfactory that they are arranged at portions (near the central part, for example) spaced apart from both ends in a side of the main surface of the thermal diffusion plate 3.

The thermal diffusion plate 3 has the third shape to cause the positional displacement of the semiconductor chip 1 within the main surface to be suppressed. In addition, forming of the protrusion parts 31 at each of the spaced-apart positions (for example, near the central part of the side) from both ends of the side in the main surface eliminates a necessity for performing an adjustment of the mounting positions of the solder 108 and the semiconductor chip 1 to the main surface of the thermal diffusion plate 3 under a high precision. In addition, overflow of the solder toward the side surface of the thermal diffusion plate 3 is suppressed at the time of melting of the solder 108, and void discharging of the solder 108 from a location near corner of the main surface of the thermal diffusion plate 3 is improved. Further, forming the upper surface side solder thickness controlling protrusions 33 and the lower surface side solder thickness controlling protrusions 34 causes the thicknesses of the solder 101 on the thermal diffusion plate 3 and the solder 102 on the first conductive layer 41 to be totally controlled and an inclination of the semiconductor chip 1 in respect to the main surface of the thermal diffusion plate 3 is reduced. Heights of the upper surface side solder thickness controlling protrusions 33 and the lower surface side solder thickness controlling protrusions 34 can be determined in reference to thicknesses desired for the solder 101 and solder 102. However, it is necessary that the height of the upper surface side solder thickness controlling protrusions 33 in respect to the main surface of the thermal diffusion plate 3 is lower than that of the protrusions 31.

As a method for forming the protrusion parts 31, a mechanical process such as a pressing process or cutting process, chemical process such as plating or etching and casting can be applied. In view of easiness in manufacturing and low cost, a pressing process is suitable for a formation of the protrusion parts 31. In addition, the upper surface side solder thickness controlling protrusions 33 and the lower surface side solder thickness controlling protrusions 34 can be simultaneously formed with the protrusion parts 31. In the present embodiment, although the upper surface side solder thickness controlling protrusions 33 and the lower surface side solder thickness controlling protrusions 34 are formed on the orthogonal lines of rectangular surface of the thermal diffusion plate 3, forming positions of these solder thickness controlling protrusions 33, 34 are not specifically restricted if they are places except a portion where the protrusion parts 31 at the main surface in the thermal diffusion plate 3 are formed.

The present invention increases a solder connecting strength between the constituent elements of the semiconductor module and further increases a reliability of electrical connection by suppressing the positional displacement between the semiconductor element and the thermal diffusion plate connected to the semiconductor element by solder. In particular, the present invention provides a connecting strength and tolerance against a high current to the solder layer formed among the semiconductor element, thermal diffusion plate and lead in a power semiconductor module.

What is claimed is:

1. A semiconductor module comprising:
   a substrate having main surface on which a first conductive layer and a second conductive layer are separately formed;
   a semiconductor element arranged on an upper surface of said first conductive layer and electrically connected to said first conductive layer; and
   a lead for electrically connecting said second conductive layer with said semiconductor element,
   wherein
   a thermal diffusion plate made of metal or alloy is arranged between the upper surface of said first conductive layer and a lower surface of said semiconductor element; and
   the thermal diffusion plate is formed with protrusion parts.

2. The semiconductor element according to claim 1, wherein the upper surface of said thermal diffusion plate and the lower surface of said semiconductor element face each other and said semiconductor element is connected to the upper surface of said thermal diffusion plate.

3. The semiconductor element according to claim 2, wherein said protrusion parts are formed on said upper surface of said thermal diffusion plate at locations nearer to end portions than to a region where said semiconductor element is connected with the upper surface of said thermal diffusion plate.

4. The semiconductor element according to claim 2, wherein further protrusions are formed on an upper surface and a lower surface of said thermal diffusion plate.

5. A semiconductor module comprising:
- a substrate having a main surface formed on which a first conductive layer and a second conductive layer are separately formed;
- a semiconductor element fixed to said first conductive layer and electrically connected to said first conductive layer; and
- a lead electrically connecting said second conductive layer with said semiconductor element, wherein
- a thermal diffusion plate made of metal or alloy is arranged between an upper surface of said first conductive layer and a lower surface of said semiconductor element; and
- a peripheral region on the upper surface of the thermal diffusion plate nearer to end portion than to a connecting region where the upper surface of the thermal diffusion plate and the lower surface of said semiconductor element are connected, is formed with protrusion parts protruding up from said connecting region.

6. The semiconductor module according to claim 5, wherein
- each of a pair of said lead and said semiconductor element, a pair of said semiconductor element and said thermal diffusion plate, a pair of said thermal diffusion plate and said first conductive layer, and a pair of said lead and said second conductive layer are connected by using the same solder material or paste, or a solder material or paste allowing for collective connections of said pairs.

7. The semiconductor module according to claim 5,
- wherein the upper surface or lower surface of said thermal diffusion plate is formed with further protrusions other than said protrusion parts.

8. The semiconductor module according to claim 5, wherein either an upper surface of said semiconductor module or an upper surface and a part of a lower surface of said semiconductor module is covered by filling resin.

* * * * *